(12) United States Patent
Chen

(10) Patent No.: US 6,909,234 B2
(45) Date of Patent: Jun. 21, 2005

(54) PACKAGE STRUCTURE OF A COMPOSITE LED

(75) Inventor: Hsing Chen, Ju-Bei (TW)

(73) Assignee: Solidlite Corporation, Shin-Chu (TW)

( * ) Notice: Subject to any disclaimer, the term of this patent is extended or adjusted under 35 U.S.C. 154(b) by 191 days.

(21) Appl. No.: 10/315,649

(22) Filed: Dec. 9, 2002

(65) Prior Publication Data

US 2004/0000867 A1 Jan. 1, 2004

(30) Foreign Application Priority Data

Jun. 27, 2002 (TW) ........................................ 91114438 A

(51) Int. Cl.[7] .............................. H01J 1/62; H01L 23/02
(52) U.S. Cl. ........................ 313/512; 257/678; 438/107
(58) Field of Search ............................. 257/88, 98–100, 257/678, 684, 687; 313/512, 498–511; 438/106–108, 118, 127

(56) References Cited

U.S. PATENT DOCUMENTS

| | | | | |
|---|---|---|---|---|
| 5,998,232 A | * | 12/1999 | Maruska | 438/46 |
| 5,998,925 A | * | 12/1999 | Shimizu et al. | 313/503 |
| 6,310,364 B1 | * | 10/2001 | Uemura | 257/100 |
| 6,396,082 B1 | * | 5/2002 | Fukasawa et al. | 257/79 |
| 6,653,661 B2 | * | 11/2003 | Okazaki | 257/98 |
| 6,667,190 B2 | * | 12/2003 | Kung et al. | 438/107 |
| 6,686,609 B1 | * | 2/2004 | Sung | 257/100 |

* cited by examiner

Primary Examiner—Joseph Williams
Assistant Examiner—German Colón
(74) Attorney, Agent, or Firm—Pro-Techtor International Services

(57) ABSTRACT

A package structure of a composite LED is to package an LED chip into a SMD LED package subbody component. Then, a single SMD LED package subbody component or multiple SMD LED package subbody components may be packaged into a large sized recessed package mother body, thereby forming the package structure of a composite LED. Thus, the quality is better, and the color shift is less, thereby enhancing the quality of production, and thereby decreasing the cost of production. In addition, the SMD LED may be previously classified according to the features, and may then be packaged into the mother body, thereby obtaining better features, such as Vf, color, brightness or the like.

8 Claims, 5 Drawing Sheets

PACKAGE STRUCTURE OF A COMPOSITE LED

BACKGROUND OF THE INVENTION

1. Field of the Invention

The present invention relates to a package structure of a composite LED, and more particularly to a package structure of a composite LED, wherein the quality is better, and the color shift is less, thereby enhancing the quality of production, and thereby decreasing the cost of production.

2. Description of the Related Art

In general, the LED (light emitting diode) has a long lifetime, can save the electric power, has a quick reaction velocity, has a high reliability, is environment protective, and may be used safely. The white LED is commonly used in the modern world.

The conventional method for manufacturing a white LED adopts a single LED chip to produce the white light. The surface of the single LED chip is coated with a layer of phosphor, so that the light produced by the single LED chip may excite the phosphor, so as to produce rays with different wavelengths. The rays with different wavelengths may mix with the rays produced by the single LED chip, so as to produce the white LED.

In the recent years, the conventional method for manufacturing a white LED adopts a blue LED chip (the wavelength is ranged between 450 nm and 470 nm) and YAG yellow phosphor. Thus, the blue light of the blue LED chip may excite the YAG yellow phosphor to produce yellow light that may be mixed with the blue light of the blue LED chip, so that the yellow color and the blue color may be complimentary with each other, thereby producing the white LED. The most important disturbance of the first conventional method for manufacturing a white LED is the color shift phenomenon. After the colloid and phosphor are mixed during the colloid bonding process, the phosphor will be deposited, thereby producing the color shift phenomenon. In addition, the amount of the YAG yellow phosphor cannot be controlled exactly, so that the white LED easily produces excessive bluish light or yellowish light.

SUMMARY OF THE INVENTION

The closest prior art references of which the applicant is aware are disclosed in his U.S. Pat. No. 5,952,681 and U.S. Pat. No. 5,962,971.

The present invention has arisen to mitigate and/or obviate the disadvantage of the conventional package structure of a composite LED.

The present invention is to provide a package structure of a composite LED, including a subbody consisting of a small sized SMD (surface mount diode) LED component added with phosphor, and a mother body consisting of a larger sized case package. Thus, the small sized SMD LED component added with phosphor may be placed in the larger sized case package, thereby forming a composite package structure which is called a composite LED including the subbody and the mother body.

In the package technology of the package structure of a composite LED of the present invention, the LED chip is initially treated on the SMD substrate by a diode bonding and wire bonding process. Then, the package resin containing the phosphor is packaged into the small sized SMD LED (such as 1.6*0.8 mm of the 0603 type or 1.0*0.5 mm of the 0402 type), so that the small sized SMD LED may be made into a white SMD LED. Then, the white SMD LED may be placed in the recessed larger sized case package. The end electrode of the white SMD LED may be connected to the inner electrode in the recessed larger sized case package. Then, a transparent resin may be added into the recess of the recessed larger sized case package, thereby forming the composite white LED including the subbody and the mother body.

The SMD is made by a molding procedure, so that the velocity of production is faster. In addition, the molding material is the solid compound that is made by the phosphor mixed with the molding colloid. The solid compound made by the phosphor mixed with the molding colloid may be coated on the LED chip evenly during the molding process, so that the color coordinate of the emitted light is more concentrated.

In addition, the package structure of a composite LED of the present invention may be used to make a high power multi-chip package structure. In general, the high power white LED may be made by the following methods.

The first method is to use multiple lamp type LEDs that are packaged together, so that the entire structure has greater brightness. In the first method, multiple LED chip are placed in the recess of the different lead frame, and are initially treated by a diode bonding and wire bonding process. Then, the phosphor is coated on the multiple LED chip, thereby packaging the multiple LED chip into the white LED. In such a manner, the volume is larger.

The second method is to use a multi-chip package structure to produce the LED with greater brightness. In the second method, the electrode that needs a wire bonding process faces downward to cover the positive and negative electrodes in the recess by using a Filp Chip technology, so that the electrode needs not to be treated by a wire bonding process, and the volume may be reduced. In such a manner, the quality, wavelength and Vf of the chips are not distinguished, so that the chips easily cause problems in the manufacturing procedure.

The difference between the package process of the package structure of a composite LED of the present invention and that of the conventional high power multi-chip package structure is described as follows. In the present invention, multiple SMD LEDs are initially packaged. Then, the multiple packaged SMD LEDs are packaged into a larger package body. Thus, the quality of production is better. In addition, the wavelength, Vf and brightness of the LED chips may be classified before package of the SMD LEDs, thereby enhancing the convenience and choice of the LED procedure. Further, the SMD is processed by the molding procedure, thereby enhancing the velocity and survival rate. Further, the volume is very small, so that the package manner of the composite structure makes the color more evenly.

On the other hand, the package structure of a composite LED of the present invention may be used to a single mixed color LED (such as purplish pink LED). In such a manner, a single SMD LED or multiple SMD LEDs may be packaged in the recess of the same lead frame. In addition, the SMD type package structure has a smaller volume, and may solve the problem in that the phosphor is not evenly distributed. Further, the wavelength, Vf, color and brightness of the LED chip may be classified before the SMD LEDs are packaged into a larger package body, thereby greatly enhancing the quality of production.

The primary objective of the present invention is to provide a package structure of a composite LED, to improve the color shift problem, to enhance the quality of production, to make a high power multi-chip LED illumination module that is available for illumination, indication and backlight.

In accordance with one aspect of the present invention, there is provided a package structure of a composite LED, comprising:

an LED chip;

a lead frame or substrate, for fixing the LED chip, and having positive and negative electrodes;

a package colloid containing a phosphor, wherein the phosphor may be excited by light emitted from the LED chip;

at least one SMD LED package subbody component, for molding the LED chip, the lead frame or substrate and the package colloid containing a phosphor into an integral body;

a large sized package mother body, having inner electrodes connected to outer electrodes of the SMD LED package subbody component; and a transparent package colloid, filled in the large sized package mother body, for covering the SMD LED package subbody component.

Preferably, the LED chip is packaged into the SMD LED package subbody component in a diode bonding and wire bonding manner or in a Filp Chip manner.

Preferably, the package structure includes a single SMD LED package subbody component or multiple SMD LED package subbody components.

Preferably, the large sized package mother body is made of a metal, ceramics, a PCB, a semiconductor or plastic material.

Preferably, the large sized package mother body has a top light type, a side light type, a lamp type and a SMD type.

Preferably, when the large sized package mother body has a side light type, the light emitting face has a circular, rectangular or oblong structure.

In accordance with another aspect of the present invention, there is provided a package method of a composite LED, comprising the steps of:

providing at least one small sized SMD LED package subbody component containing a phosphor;

providing a large sized package mother body;

packaging the small sized SMD LED package subbody component into the large sized package mother body, so that outer electrodes of the SMD LED package subbody component are connected to inner electrodes of the large sized package mother body; and adding a package colloid into the large sized package mother body, thereby forming a composite LED.

Preferably, the composite LED includes a single SMD LED package subbody component or multiple SMD LED package subbody components.

Preferably, the SMD LED package subbody component includes a red SMD LED, a green SMD LED and a blue SMD LED which are packaged into the large sized package mother body simultaneously, thereby forming a single triple-wavelength white LED.

Preferably, the SMD LED package subbody component includes a white SMD LED or a mixed color SMD LED excited by other phosphor.

Further benefits and advantages of the present invention will become apparent after a careful reading of the detailed description with appropriate reference to the accompanying drawings.

DETAILED DESCRIPTION OF THE INVENTION

Figure 1:
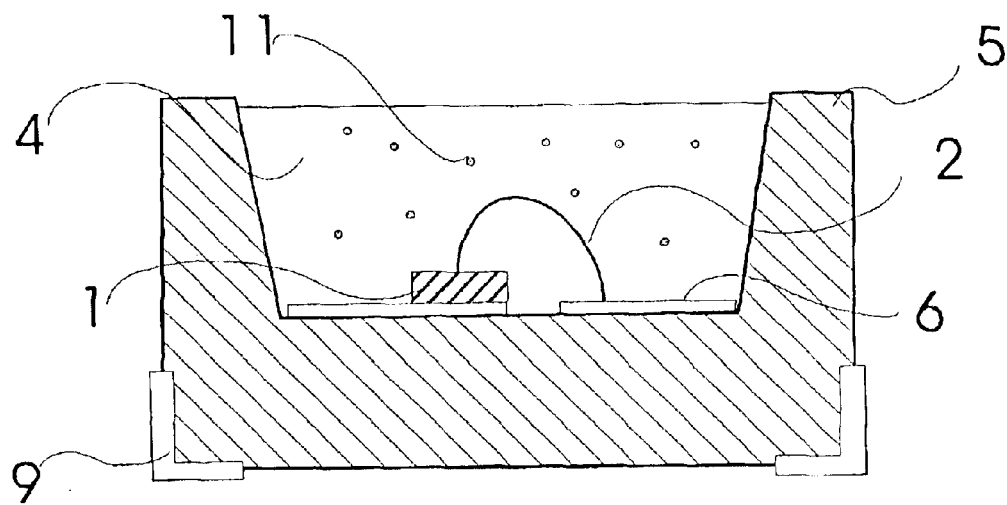
FIG. 1 is a schematic view of a conventional top light type white LED package structure in accordance with the prior art.
Figure 2:
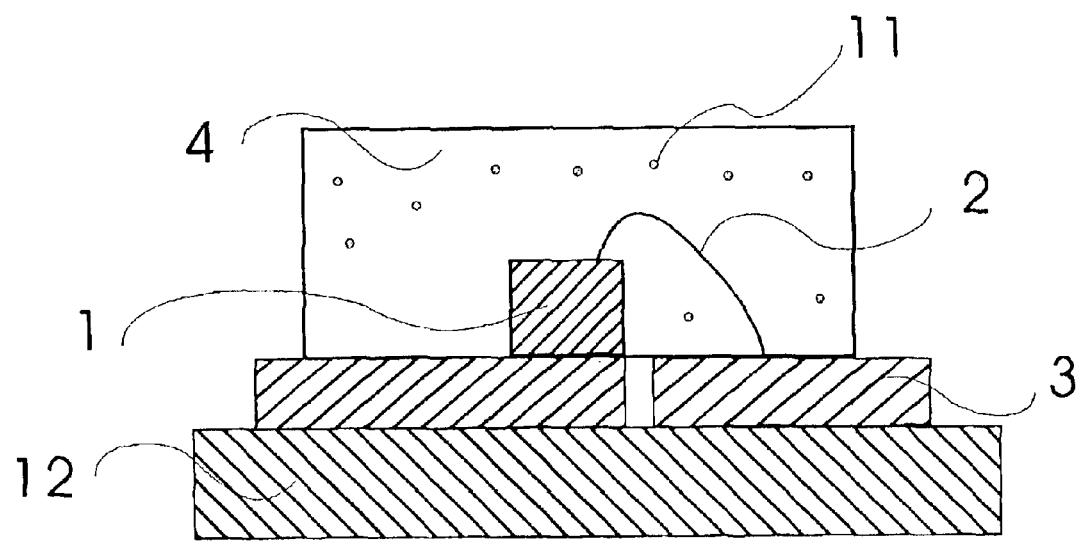
FIG. 2 is a schematic view of a conventional PCB type white LED package structure in accordance with the prior art.
Figure 3:
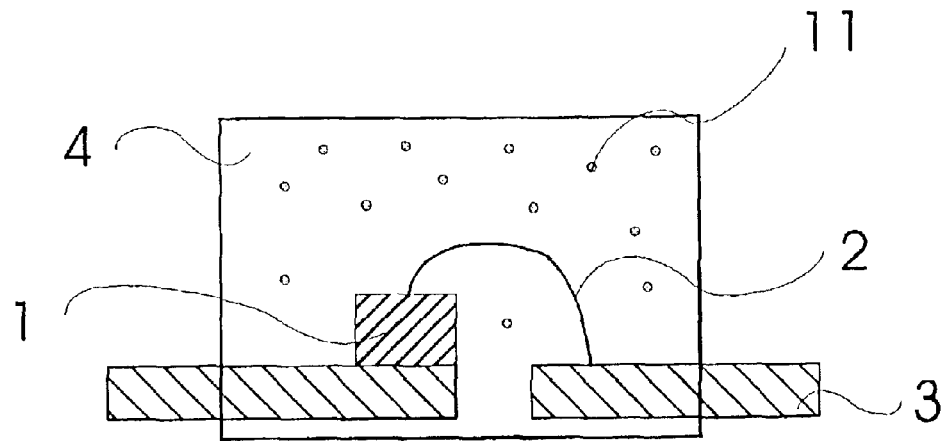
FIG. 3 is a schematic view of a conventional molding SMD type white LED package structure in accordance with the prior art.
Figure 4:
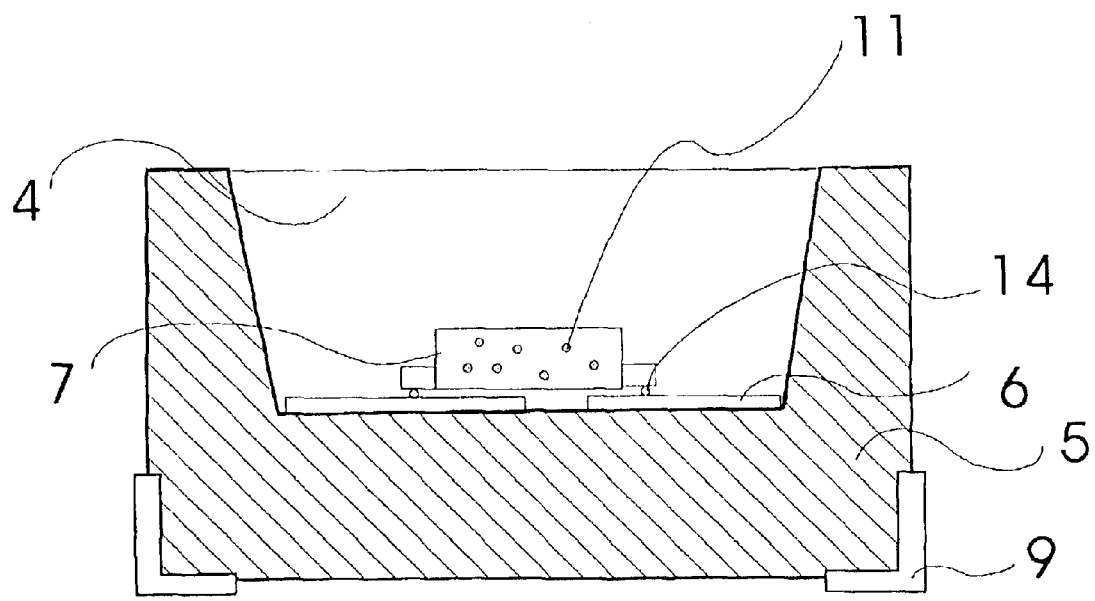
FIG. 4 is a schematic view of a package structure of a composite LED in accordance with a first embodiment of the present invention.

Referring to the drawings and initially to FIG. 4, a package structure of a composite LED in accordance with a first embodiment of the present invention comprises an LED chip 1, a SMD package support 3, a phosphor 11, a package colloid (or epoxy) 4, a top light package support 5, two inner electrodes 6, and two top light outer electrodes 9.

The LED crystal 1 is a blue LED chip 1 (the wavelength is ranged between 430 nm and 470 nm) that may provide a light source and may excite the phosphor 11 to produce other wavelengths.

The phosphor 11 is a yellow phosphor 11 that may be used to absorb the blue light emitted from the blue LED chip 1, and may convert the blue light into the yellow light of a different wavelength. The yellow light and the blue light are complimentary with each other to produce the white light.

The manufacturing process of the package structure of a composite LED in accordance with the first embodiment of the present invention is described as follows.

First of all, a blue LED chip 1 is chosen. Then, the blue LED chip 1 is placed on the SMD package support 3 by a diode bonding and wire bonding process, and is packaged into a SMD LED 7 in a molding manner the molding compound is previously added with the required phosphor 11, and is evenly distributed around the periphery of the blue LED chip 1 in the molding process, so that a white SMD LED 7 may be made in the molding process. Then, the SMD LED 7 is placed on a larger sized top light package support 5 and is heated, so that the terminal electrodes of the SMD LED 7 are combined with the two inner electrodes 6 of the larger sized top light package support 5. Finally, the package colloid (or epoxy) 4 are added into the recess of the larger sized top light package support 5, thereby completing a single top light type white light composite LED in accordance with the first embodiment of the present invention.

Figure 5:
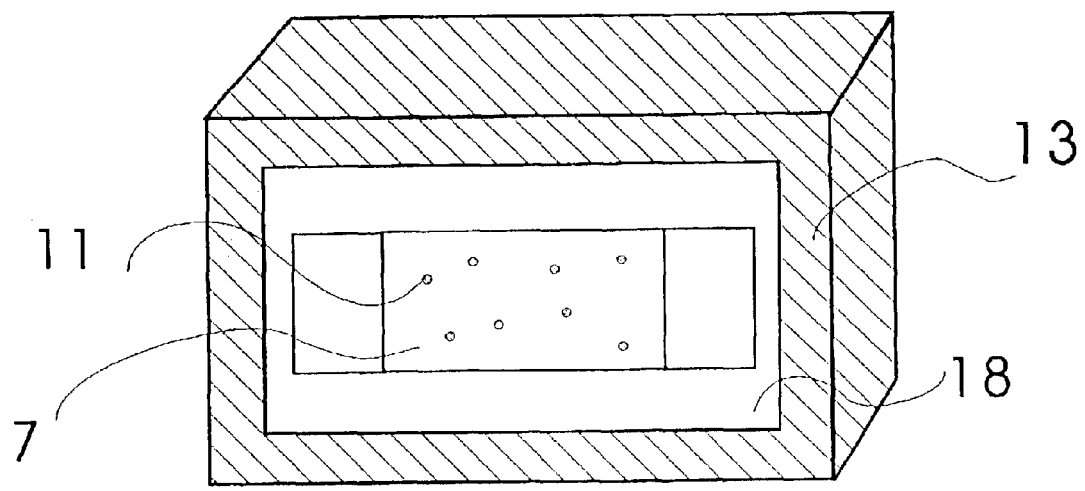
FIG. 5 is a schematic view of a package structure of a composite LED in accordance with a second embodiment of the present invention.
Figure 6:
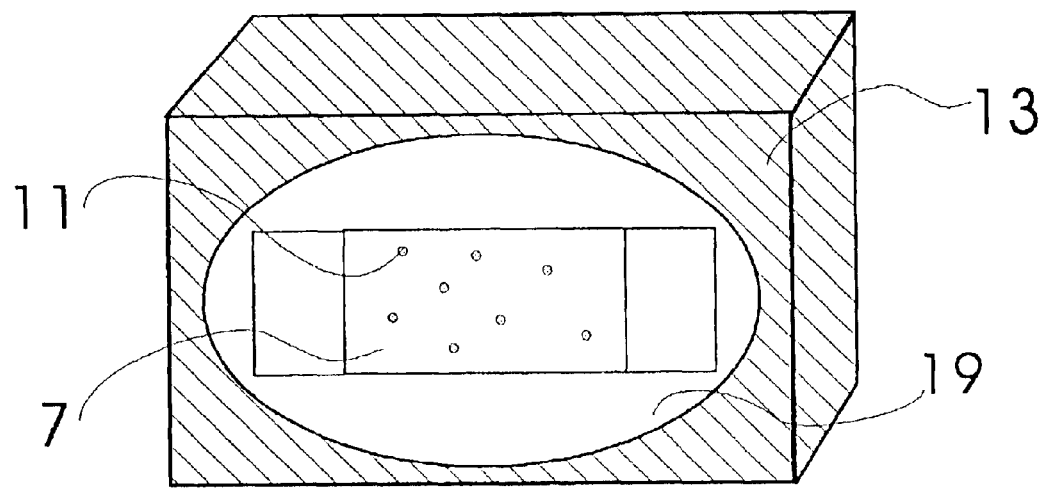
FIG. 6 is a schematic view of a package structure of a composite LED in accordance with the second embodiment of the present invention.

Referring to FIGS. 5 and 6, a package structure of a composite LED in accordance with a second embodiment of the present invention comprises a SMD LED 7, a phosphor 11, a package colloid (or epoxy) 4, a side light package support 13, and a rectangular package 18 or an oblong package 19.

FIG. 5 is a schematic view of a rectangular package of the package structure of a composite LED in accordance with the second embodiment of the present invention, and FIG. 6 is a schematic view of an oblong package of the package structure of a composite LED in accordance with the second embodiment of the present invention.

The SMD LED 7 is a white light SMD LED 7 to provide a subbody of a white light source.

The side light package support 13 has an inside containing the rectangular package 18 or the oblong package 19, so that the side light package support 13 may function as a mother body of the package structure.

The manufacturing process of the package structure of a composite LED in accordance with the second embodiment of the present invention is the same as that of the package structure of a composite LED in accordance with the first embodiment of the present invention, and is described as follows.

The SMD LED 7 is placed in the side light package support 13 and is heated, so that the terminal electrodes of the SMD LED 7 are combined with the two inner electrodes 6 of the larger sized side light package support 13, thereby forming a single side light type white light composite LED in accordance with the second embodiment of the present invention.

Figure 7:
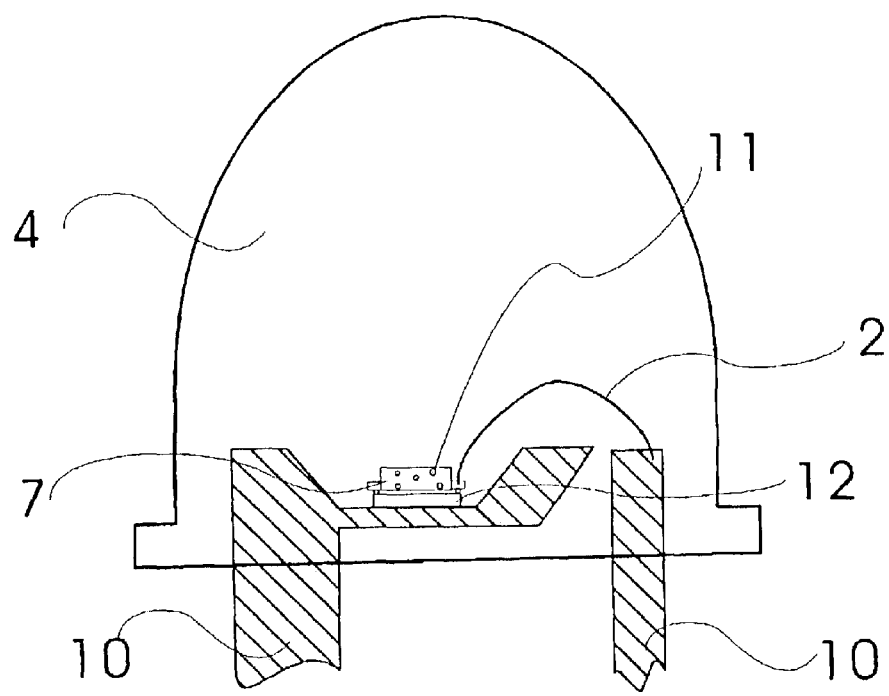
FIG. 7 is a schematic view of a package structure of a composite LED in accordance with a third embodiment of the present invention.

Referring to FIG. 7, a package structure of a composite LED in accordance with a third embodiment of the present invention comprises a SMD LED 7, a phosphor 11, a package colloid (or epoxy) 4, a lamp type package support 10, a conducting wire 2, and a PCB 12.

The SMD LED 7 is a white SMD LED 7 to provide a subbody of a white light source.

The PCB 12 is a printed circuit board that may be used to support the SMD LED 7 and to connect the lamp type package support 10.

The manufacturing process of the package structure of a composite LED in accordance with the third embodiment of the present invention is the same as that of the package structure of a composite LED in accordance with the first embodiment of the present invention, and is described as follows.

The white SMD LED 7 is initially placed on the PCB 12, and is then placed in the package of the lamp type package support 10. The white SMD LED 7 is treated by a wire bonding process, so that the white SMD LED 7 is connected to the lamp type package support 10. Finally, the white SMD LED 7 is packaged by the mold into a single lamp type white composite LED in accordance with the third embodiment of the present invention.

Figure 8:
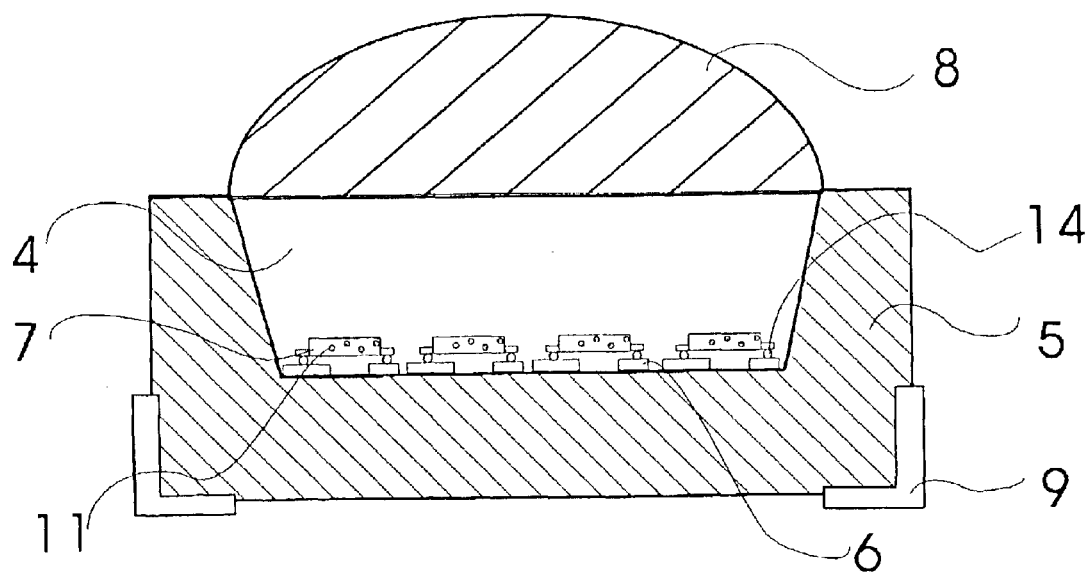
FIG. 8 is a schematic view of a package structure of a composite LED in accordance with a fourth embodiment of the present invention.

Referring to FIG. 8, a package structure of a composite LED in accordance with a fourth embodiment of the present invention comprises a SMD LED 7, a phosphor 11, a package colloid (or epoxy) 4, a top light package support 5, a lens 8, multiple inner electrodes 6, and two top light outer electrodes 9.

The SMD LED 7 is a white SMD LED 7 to provide a subbody of a white light source. In the fourth embodiment of the present invention, multiple SMD LEDs 7 are packaged in a larger sized top light package support 5.

The lens 8 may be used to focus the light emitted from the multiple SMD LEDs 7.

The manufacturing process of the package structure of a composite LED in accordance with the fourth embodiment of the present invention is the same as that of the package structure of a composite LED in accordance with the first embodiment of the present invention, and is described as follows.

The multiple white SMD LEDs 7 are placed on the multiple inner electrodes 6 in the larger sized top light package support 5 to conduct the multiple white SMD LEDs 7. Then, the multiple white SMD LEDs 7 are packaged by the package colloid (or epoxy) 4 into a single top light type white light composite LED in accordance with the fourth embodiment of the present invention. The lens 8 may be made on the light outlet face of the top light type LED in a coating manner. FIG. 8 shows multiple high power white light composite LEDs in accordance with the fourth embodiment of the present invention.

Figure 9:
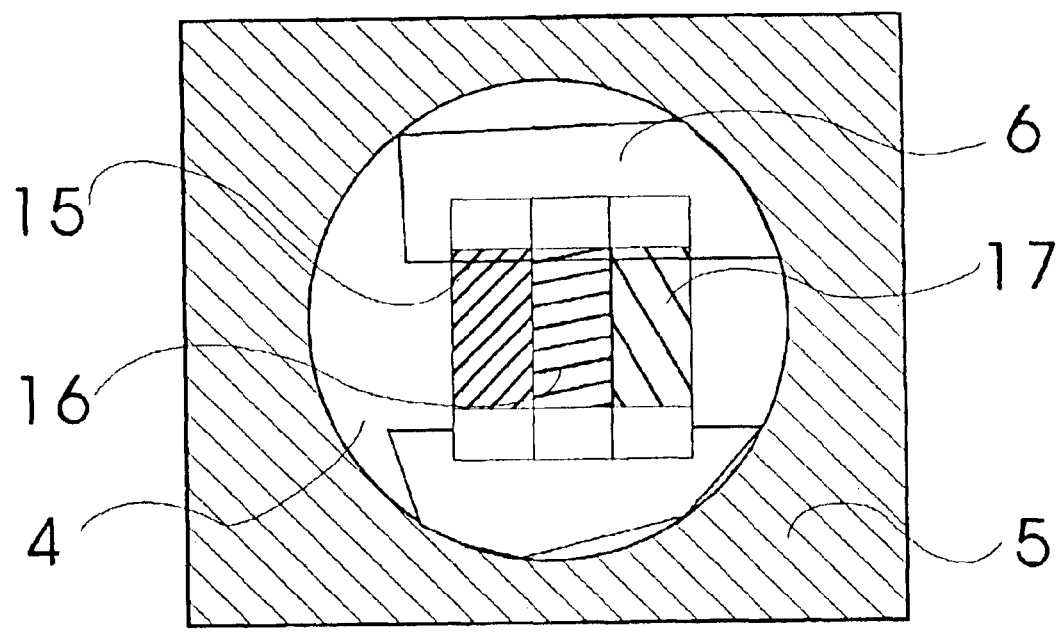
FIG. 9 is a schematic view of a package structure of a composite LED in accordance with a fifth embodiment of the present invention.

Referring to FIG. 9, a package structure of a composite LED in accordance with a fifth embodiment of the present invention comprises a blue SMD LED 15, a red SMD LED 16, a green SMD LED 17, a package colloid (or epoxy) 4, a top light package support 5, inner electrodes 6, and top light outer electrodes 9.

The manufacturing process of the package structure of a composite LED in accordance with the fifth embodiment of the present invention is described as follows.

First of all, a blue SMD LED 1, a red SMD LED 1 and a green SMD LED 1 are chosen. Then, the blue, red and green SMD LEDs 1 are placed on the SMD package support 3 by a diode bonding and wire bonding process, and are respectively packaged into the blue SMD LED 15, the red SMD LED 16 and the green SMD LED 17 by a molding process. Then, the blue SMD LED 15, the red SMD LED 16 and the green SMD LED 17 are placed in the larger sized top light package support 5 and are fixed by the joints 14, so that the electrodes of the blue SMD LED 15, the red SMD LED 16 and the green SMD LED 17 are conducted with the inner electrodes 6 in the larger sized top light package support 5. Finally, the package colloid (or epoxy) 4 is packaged into the larger sized top light package support 5, thereby forming a triple-wavelength white light composite LED in accordance with the fifth embodiment of the present invention, wherein the triple-wavelength white consists of the blue SMD LED 15, the red SMD LED 16 and the green SMD LED 17.

The white SMD LED of the package structure of a composite LED in accordance with the present invention may use the blue light of the blue LED chip to excite the YAG yellow phosphor to produce a yellow light that may be mixed with the blue light of the blue LED chip, so that the yellow color and the blue color may be complimentary with each other, thereby producing the white LED with two wavelengths. In addition, the white SMD LED of the package structure of a composite LED in accordance with the present invention may also use the ultraviolet LED chip (the wavelength is ranged between 350 nm and 390 nm) which is added with the phosphor mixed with red, blue and green colors, or use the violet LED chip (the wavelength is ranged between 390 nm and 410 nm) which is added with the phosphor mixed with red, blue and green colors, or use the blue LED chip (the wavelength is ranged between 430 nm and 480 nm) which is added with the phosphor mixed with red and green colors, so as to produce the white light with three wavelengths, thereby producing a white light source with better colors.

The package structure of a composite LED in accordance with the present invention is to improve the mixed-color LED excited by the phosphor, such as the white LED, the purplish pink LED or the like. If the phosphor layer is packaged in a coating manner, the phosphor is deposited at a greater velocity, so that the distribution is uneven, and the stability of the X and Y color coordinates cannot be controlled easily, thereby decreasing the quality of production. In addition, the drop manner has a complicated process due to the phosphor colloid, and the velocity of production is decreased. The package structure of a composite LED in accordance with the present invention may initially make a smaller sized SMD LED component by a molding process. Then, a single smaller sized SMD LED component or a plurality of smaller sized SMD LED components is/are packaged into a larger sized package structure. The phosphor may be fully mixed with the molding compound by the molding process, so that the phosphor is distributed more evenly and is controlled easier during the molding process, thereby enhancing the quality of production, and thereby decreasing the cost of production.

In conclusion, the package structure of a composite LED in accordance with the present invention has the following advantages.

1. The quality is better, and the color shift is less, thereby enhancing the quality of production, and thereby decreasing the cost of production.

2. The SMD LED may be previously classified according to the features (such as Vf, color, brightness or the like), and may then be packaged into the mother body, thereby obtaining better features (such as Vf, color, brightness or the like). It is appreciated that, the brightness of the LED is shifted due to different Vf.

3. Multiple SMD LEDs may be packaged together in the common structure, to form the LED with greater brightness and power, without having to adopt a larger sized chip.

Although the invention has been explained in relation to its preferred embodiment as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A package structure of a composite LED, comprising:
   an LED chip;
   a substrate upon which to fix the LED chip, the substrate having positive and negative electrodes;
   a package colloid containing a phosphor, such that the phosphor is excited by light emitted from the LED chip;
   a plurality of SMD LED package subbody components included in the LED chip, the substrate and the package colloid containing a phosphor, all being formed into an integral body;
   a large sized package mother body having inner electrodes connected to outer electrodes of the SMD LED package subbody components; and
   a transparent package colloid in the large sized package mother body, for covering the SMD LED package subbody components.

2. The package of a composite LED in accordance with claim 1, wherein the LED chip is packaged into the SMD LED package subbody component in a diode bonding and wire bonding manner or in a Filp Chip manner.

3. The package of a composite LED in accordance with claim 1, wherein the large sized package mother body is made of a metal, a PCB, a semiconductor or plastic material.

4. The package of a composite LED in accordance with claim 1, wherein the large sized package mother body has a top light type, a side light type, a lamp type and a SMD type.

5. The package of a composite LED in accordance with claim 4, wherein the large sized package mother body has a top light type, a side light type, a lamp type and a SMD type.

6. The package method of a composite LED, comprising the steps of:
   providing a plurality of small sized SMD LED package subbody components each containing a phosphor;
   providing a large sized package mother body;
   packaging the small sized SMD LED package subbody components into the large sized package mother body, so that outer electrodes of the SMD LED package subbody components are connected to inner electrodes of the large sized package mother body; and
   adding a package colloid into the large sized package mother body, thereby forming a composite LED.

7. The package method of a composite LED in accordance with claim 6, wherein the SMD LED package subbody components included a red SMD LED, a green SMD LED and a blue SMD LED which are packaged into the large sized package mother body simultaneously, thereby forming a single triple-wavelength white LED.

8. The package method of a composite LED in accordance with claim 6, wherein the SMD LED package subbody components includes a white SMD LED or a mixed color SMD LED excited by other phosphor.

* * * * *